United States Patent [19]

Crewe

[11] Patent Number: 4,833,362
[45] Date of Patent: May 23, 1989

[54] ENCAPSULATED HIGH BRIGHTNESS ELECTRON BEAM SOURCE AND SYSTEM

[75] Inventor: Albert V. Crewe, Palos Park, Ill.

[73] Assignee: Orchid One, Palos Hills, Ill.

[21] Appl. No.: 183,643

[22] Filed: Apr. 19, 1988

[51] Int. Cl.[4] .................... H01J 37/18; H01J 41/16
[52] U.S. Cl. ........................................ 313/7; 313/545; 313/561; 313/311
[58] Field of Search ................ 313/7, 558, 561, 545, 313/547, 311; 250/396 R; 417/48, 51

[56] References Cited

U.S. PATENT DOCUMENTS

| | | | |
|---|---|---|---|
| 3,678,333 | 7/1972 | Coates et al. | 315/31 |
| 4,019,077 | 4/1977 | Sakitani | 313/558 X |
| 4,074,313 | 2/1978 | Reisner et al. | 358/128 |
| 4,725,736 | 2/1988 | Crewe | 250/396 R |

FOREIGN PATENT DOCUMENTS

| | | |
|---|---|---|
| 49761 | 4/1977 | Japan . |
| 124966 | 9/1979 | Japan . |
| 2077487 | 12/1981 | United Kingdom . |

OTHER PUBLICATIONS

Journal of Applied Physics, vol. 39, No. 13, 12/68, Crewe et al., "A High Resolution Scanning Transmission Electron Microscope", pp. 5861–5868.

J. Vac. Sci. Tech. A3(2), Mar./Apr. 1985, Giorgio et al., "An Updated Review of Getters and Gettering", p. 417–423.

Primary Examiner—David K. Moore
Assistant Examiner—Sandra L. O'Shea

[57] ABSTRACT

An encapsulated high brightness source for use in or with an electron beam system such as an electron beam microscope. The source preferably includes a field emitter. The source includes source enclosure means which defines an ultra high vacuum enclosure for the field emitter. A lens which serves as part of the ultra high vacuum enclosure for the source defines a differential pressure aperture. Other lens elements draw electrons from the field emitter and form a focus on axis in the vicinity of the differential pressure aperture, which serves as an effective point source for the associated electron beam system. The source may be permanently built-in or modular; if modular, it may be assembled, tested, and stored in an ultra high vacuum operative condition for OEM assembly or as a replacement part.

18 Claims, 4 Drawing Sheets

ENCAPSULATED HIGH BRIGHTNESS ELECTRON BEAM SOURCE AND SYSTEM

CROSS-REFERENCE TO RELATED APPLICATIONS

This invention is related to, but in no way dependent upon my co-pending applications Ser. No. 909,015 filed Sept. 18, 1986; Ser. No. 895,199 filed Aug. 11, 1986 (now U.S. Pat. No. 4,740,705) and Ser. No. 895,200 filed Aug. 11, 1986 (now U.S. Pat No. 4,725,736).

BACKGROUND OF THE INVENTION

This invention relates to electron beam systems such as scanning and non-scanning electron microscopes, electron beam lithography systems, and the like.

One class of such systems utilizes a thermionic source. Another smaller class of high performance systems utilizes a high brightness electron source such as a field emission cathode. The cost of such high performance systems is in general very much greater than that of the class of systems using thermionic sources due in large part to the very high cost of the ultra high vacuum equipment needed to pump such systems to the ultra high vacuum levels which are needed to support the field emission source—typically $10^{-9}$ to $10^{-10}$ torr.

There is a strong need for a system having the high performance of systems having field emission sources but with a cost more comparable to that of systems with thermionic sources.

It is an object of this invention to provide an electron beam system having a high brightness electron beam source not requiring a costly high vacuum pumping system, and thus an electron beam system with the desirable capabilities attending use of a high brightness source at a cost more typical of systems having much less capable sources.

It is an object to provide an electron beam system which has a self-pumped high brightness source, such as a field emitter, and which is much less expensive to manufacture than conventional high brightness source systems.

It is an object of this invention to provide an encapsulated high brightness source for electron beam systems which may be modular in construction. More specifically, it is an object to provide a modular encapsulated high brightness source which can be installed as original equipment or as a retrofit in various electron beam systems of the types adapted for a thermionic source, lending the high performance associated with high brightness sources to systems of the type normally employing a thermionic source.

It is an object to provide such a modular encapsulated source which is capable of being assembled, tested and stored in an operative condition for quick and easy installation as original equipment in an electron beam system, or as a replacement part or retrofit.

It is yet another object to provide such a modular encapsulated high performance source which is relatively low in manufacturing cost.

It is still another object to provide an encapsulated source, modular or built-in, which is readily adapted for low voltage applications wherein it is desired to have low electron beam energy, as where electron charge-up is undesired, or wherein the specimen is fragile.

It is an object to provide such a source which can be adapted for attachment to or incorporation in the high voltage terminal of any microscope having typical moderate or high operating voltages—for example, in the range of 50 Kv to 1 million volts.

It is yet another object to provide such a source which is capable of preserving its ultra high vacuum state even in the event of sudden loss of vacuum in the associated electron beam system.

It is still another object to provide such a source which has a long shelf life and a long operating life.

It is a further another object of this invention to provide such a source offering convenient adjustment of operating beam voltage and current, and precise control of the location of the effective electron point source.

PRIOR ART

U.S. Pat. No. 3,678,333 concerns a field emission electron gun for electron microscopes and discloses the use of a getter for pumping an ultra high vacuum region within the gun. The getter is of the sublimator type and would be completely unsatisfactory in the source with which this invention is concerned due to its contamination of the containing vacuum chamber of the conductive material, with the inevitably attendant electrical discharge problems. Further, the getter-pumped volume in the gun of this patent is unnecessarily large. See also related U.S. Pat. Nos. 3,766,427 and 3,784,815.

Differential pressure systems and microscopy are well known, as are electron guns having electrostatic focus lenses. See "Field Emission Scanning Microscope With Parallel Plate Gun Electrodes", Shimizu et al, SCANNING ELECTRON MICROSCOPY/1973 (Part I) Proceedings of the Sixth Annual Scanning Electron Microscope Symposium, IIT Institute Research, Apr. 1973, pages 73–79. See also "The Development of a Field Emission Scanning Electron Microscope", Swann et al, SCANNING ELECTRON MICROSCOPY/1973 (PART I), Proceedings of the Sixth Annual Scanning Electron Microscope Symposium, pages 57–63.

Also, see Patent Abstracts of Japan, Vol. 1, No. 117, (4622) (E-77), 6 October 1977 and JP, A, 5249761 (Hitachi) 21 April 1977; U.S. Pat No. 3,678,333 (Coates, et al); U.S. Pat. No. 4,074,313 (Reisner et al); Journal of Applied Physics, Vol. 39, No. 13, December 1968; Patent Abstracts of Japan, Vol. 3, No. 145 (E-155), 30 November 1979; Journal of Vacuum Science & Technologie, Vol. 3, No. 2, March-April 1985 (Woodbury, N.Y.) and British Patent No. 2,077,487 (Seas Getters).

BRIEF DESCRIPTION OF THE DRAWINGS

FIG. 3A illustrates a portion of a snap valve assembly shown in FIG. 3, but with a snap valve in an open condition;

BRIEF DESCRIPTION OF THE PREFERRED EMBODIMENT

Figure 1:
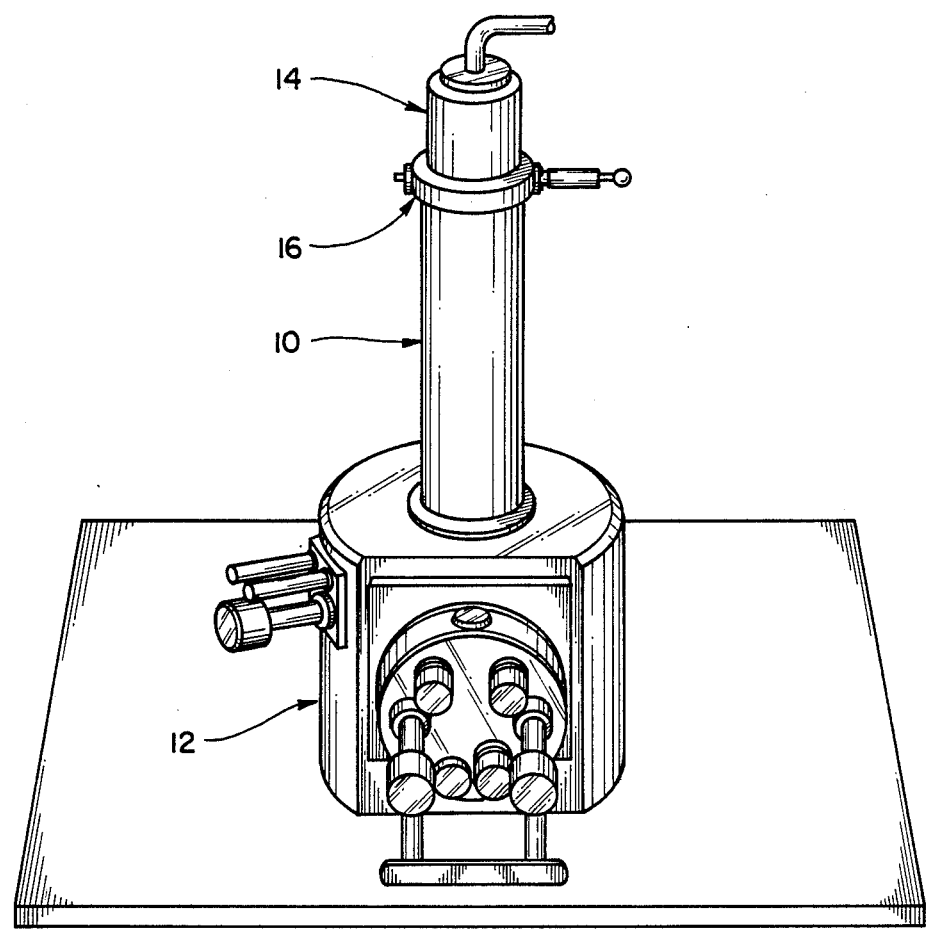
FIG. 1 is a somewhat schematic perspective view of an electron microscope with which this invention may be adapted to be used.

The principles of this invention may be employed in connection with a variety of electron beam systems. FIG. 1 illustrates an electron beam microscope with which the present invention may be utilized. The FIG. 1 electron beam microscope is illustrated schematically as comprising electron beam column 10 and a specimen chamber 12. Mounted on the column 10 is an encapsulated high brightness electron source 14 constructed in accordance with the principles of this invention. As will be described in detail hereinafter, the source 14 may be built-in as a permanent part of an electron beam installation, or may be of modular connstruction adapted to be manufactured, tested and stored apart from its ultimate intended installation. The present embodiment is of modular adaption. The modular source 14 is illustrated as including a valve assembly 16.

Figure 2:
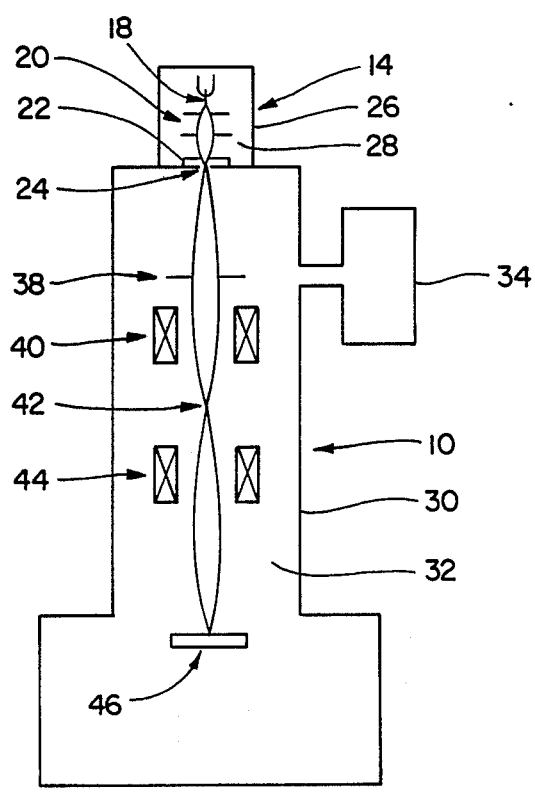
FIG. 2 is a highly schematic view of an electron beam optical system as may be used in an electron microscope of the general type shown in FIG. 1.

FIG. 2 illustrates in highly schematic form an electron optical system for an electron beam system such as shown in FIG. 1, comprising a field emission tip 18 and an electrostatic lens 20 which forms an image of the electron source at the tip 18 on axis in the vicinity of a differential pressure aperture formed in one of the lens elements 22, as constitutes part of this invention and will be fully described hereinafter. In accordance with a primary objective of this invention, an effective high brightness point source 24 is formed in the aperture in lens element 22 which serves as the source of electrons for the associated electron beam system.

A source vacuum enclosure means is shown schematically at 26 which defines a source vacuum enclosure 28. FIG. 2 illustrates schematically a system vacuum enclosure means 30 which defines therewithin a system vacuum enclosure 32. A vacuum pump 34 is illustrated schematically for pumping the system vacuum enclosure to suitable vacuum levels—typically $10^{-5}$ to $10^{-6}$ torr. Whereas the FIG. 2 system has been shown schematically as having a single system vacuum enclosure encompassing the entire electron beam system below the point source 24, it should be understood that the present invention is equally applicable to an electron beam system of the differential pressure type wherein the system vacuum enclosure may be divided into a plurality of vacuum enclosures pumped to different vacuum levels.

As will become more evident from the following description, the overall system with the encapsulated source (modular or permanently built-in) installed becomes a differential pressure system due to the differential pressure aperture provided at the output of the source 14.

Completing the FIG. 2 description—a stop 38 limits and defines the beam. A condenser lens is illustrated at 40 for forming an intermediate beam cross-over 42. An objective lens 44 images the cross-over 42 on a specimen supported by a specimen holder 46. The condenser lens 40 is shown for completeness although in many applications it may not be necessary.

Figure 3:
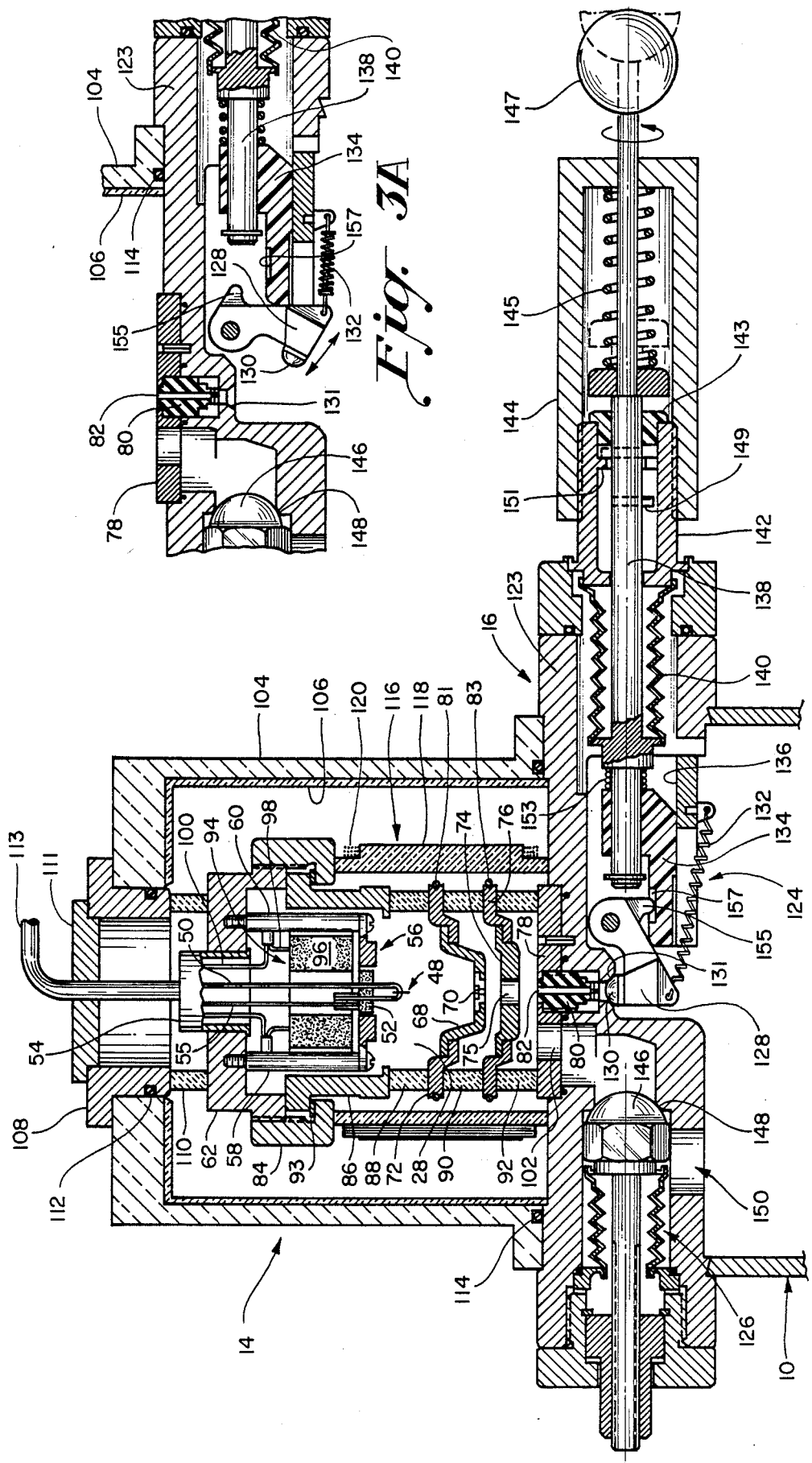
FIG. 3 is a section view of a modular encapsulated field emission source embodying the principles of the present invention.
Figure 4:
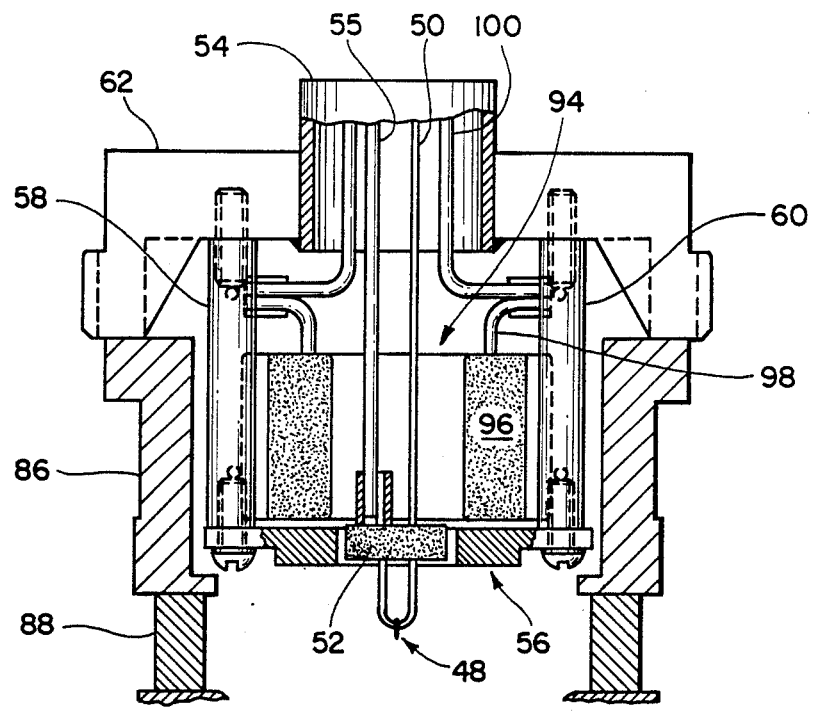
FIG. 4 is an enlarged view of a portion of the FIG. 3 assembly showing in more detail the cathode region.

As noted, it is an object of this invention to provide a low cost, high performance encapsulated high brightness source for electron beam systems of various types, which source may be modular in construction or permanently installed. FIGS. 3, 3A and 4 illustrate an embodiment which is modular in construction.

Whereas the principles of the invention may be employed with various high brightness sources, in the illustrated preferred embodiment, the high brightness source is illustrated as taking the form of a field emission tip 48 supported by a filament 50. The field emitter may be of the cold emitter or zirconiated type.

The filament 50 is held by a tip mount insulator 52 which may, for example, be formed of a recrystallized alumina ceramic. The filament leads pass to the outside through a multi-pin feedthrough 54. A filament supply lead is shown at 55. The tip mount insulator 52 is supported by a spider 56 which may be formed, for example from 304 stainless steel. The spider has three 120-degree-spaced mounting fingers supported by mounting pins, two of which are shown at 58 and 60, in turn supported by a cap mounting flange 62. The spider 56 has three tip adjustment screws (not shown) spaced at 60 degrees from the spider mounting fingers. The tip adjustment screws bear on the tip mount insulator 52 and are used to center the tip 48 on the electron optical axis.

A three element electrostatic lens is illustrated for forming an image of the electron source formed at the tip 48, which image will become the effective point source for the associated electron beam system, all as will be described in detail hereinafter.

A first electrostatic lens element 68 serves as an anode to draw electrons from the tip 48. It may be composed of titanium alloy and may have, for example, a 200 micrometer aperture 70 which defines and sizes the electron beam.

The first lens element 68 is supported by and electrically connected to a lens element mounting ring 72 which may be composed of a titanium alloy. It may take the form of a spider having three 120-degree-spaced fingers for supporting the lens element 68.

The second lens element 74, which also may be composed of titanium alloy may have an aperture 75 in the order of 4 millimeters in diameter, for example. The second lens element 74 is supported by a mounting ring 76 which may be of the same construction as mounting ring 72.

A third and final lens element 78 has a screw-in insert 80 having formed therein an aperture 82 which serves as a differential pressure aperture, as will be described in more detail hereinafter. The diameter of the aperture 82 may be in the range of 10–30 microns, preferably about 20 microns.

The mounting rings 72 and 74 receive conductive loops 81 and 83, which may be formed of copper, for example, which are electrically connected to conductors for bringing appropriate voltages to the first and second lens elements 68, 74, respectively.

It is an important aspect of this invention that the voltages applied to the first, second and third lens elements 68, 74 and 78, respectively, can be adjusted to establish appropriate operating parameters for the electron gun. The potential on the first lens element 68 is positive relative to the tip 48 and determines the tip current. The current is an exponential function of the voltage and must be carefully controlled.

The potential on lens element 74 is negative relative to the aforesaid potential applied to the first lens element. The voltage applied to the second lens element 74 can vary over a wide range and is used to control the location of the beam focus. The voltage on third lens element 78 is the final accelerating voltage of the electron beam and is positive relative to the potential on element 74. The voltage on element 78 determines the electron beam energy and can be adjusted for the particular application. It is a feature of the present invention for low voltage applications that the chromatic aberration and spherical aberration of the lens are low for low values of voltage applied to the third lens element 78.

By way of example, the voltage applied between the first lens element 68 and the field emission source 48 may be in the range of 0–4 kilovolts; the voltage applied to the second lens element 74 may be in the range of 500 volts to 7 kilovolts. The third lens element 78 is preferably at ground potential.

For reasons which will become evident as this description continues, a source vacuum enclosure means is provided which defines a hermetic source vacuum enclosure 28 in which is situated the tip 48 and the above-described electrostatic lens. The source vacuum enclosure means is illustrated as including the multi-pin feed-through 54, the cap mounting flange 62, a clamp ring 84 (304 stainless steel, for example), a top ring 86 (titanium alloy, e.g.), and three insulator rings 88, 90 and 92 (re-crystallized alumina ceramic, e.g.) which serve to space the lens elements from each other and from the top ring 86. A clamp ring thrust washer 93 is located betrween the top ring 86 and clamp ring 84. The third lens element 78 completes the source vacuum enclosure means.

Gold seals may be introduced, as necessary, between various joined surfaces defining the source enclosure means. The materials described as being composed of titanium alloy are composed of that material for thermal expansion compatibility with the adjoined ceramic materials and are brazed thereto.

The source vacuum enclosure means described above defines an ultra high vacuum source enclosure 28 within which the field emission tip 48 is maintained at an appropriate vacuum level—typically $10^{-9}$ to $10^{-10}$ torr. The extremely restricted size of the differential pressure aperture 82 formed in the insert 80 in the lens element 78 is selected with consideration for maintaining the ultra high vacuum within the source vacuum enclosure.

In accordance with an aspect of this invention, the ultra high vacuum enclosure volume containing the field emission tip 48 and electrostatic lens is extremely small, thus minimizing the pumping requirement of the ultra high vacuum pumping means utilized to evacuate this enclosure.

In accordance with an aspect of this invention, vacuum pumping means within or in communication with the source vacuum enclosure is provided for pumping the source enclosure to a predetermined ultra high vacuum level suitable for operation of a field emitter source. In the illustrated embodiment, the vacuum pumping means for pumping the source enclosure is illustrated as a passive pump—preferably a getter 94 of the non-evaporated porous type, as described in more detail below. A getter of this type is capable of pumping the relatively small volume ultra high vacuum source enclosure defined within the gun to a predetermined ultra high vacuum level in the range of $10^{-9}$ to $10^{-10}$ torr. The very restricted size of the aperture 82 in the insert 80 in the third lens element 78 is selected with consideration for maintaining the ultra high vacuum in the source enclosure containing the field emitter tip 48. As noted, the aperture 82 is of such small radius (typically 10–30 microns) as to make possible the maintaining of a significant differential vacuum across the lens element 78.

By way of illustration, the getter 94 may be a non-evaporable porous getter such as manufactured by SAES Getters S.p.A. of Milano, Italy. Such non-evaporable porous getters may use zirconium powder as the active material, sintered at a high temperature with graphite powder, conferring the required characteristics of high porosity and large surface area as well as good mechanical strength. In the use of such getters at high temperatures (for example, about 300 degrees C), gas sorption is not limited to the surface of the zirconium grains but includes diffusion into the bulk, resulting in superior gettering action.

Getter 94 is illustrated as taking a toroidal form; other shapes are available and may be suitable depending upon the application. In order to activate the getter material, it must be heated under vacuum for a time sufficient to remove from the surface of the getter material the protective layer formed at room temperature during the first exposure to air at the end of the manufacturing process. Full activation of the getter material is obtained by heating the getter, e.g. under a vacuum of $10^{-3}$ torr at 900 degrees C for ten minutes. Other combinations of temperature and time are possible to produce complete activation. When only a limited activation time or a low heating temperature are possible, reasonable sorption characteristics can be achieved by a partial activation of the getter. Activation can also be achieved by intermittent heating of the gettering material, provided that the cumulative heating time is the same as that of a continuing activation. In this way, localized overheating of nearby parts can be minimized.

The pumping speed of non-evaporable porous getters of the type described tends to decrease with the progressive sorption of gaseous species until it eventually can become too low to cope with the degassing rate of the device in which the getter is mounted. By reheating the getter material, a process called reactivation, it is possible to restore the pumping efficiency of the getter. Such reactivation is performed by heating the material at a temperature slightly below or equal to the activation temperature—for example, 800–900 degrees C. The time necessary for reactivation is usually shorter than for activation. Such non-evaporable porous getters can be reactivated several times. Such non-evaporable getters as described, are capable of pumping an ultra high vacuum source enclosure of the dimensions described and illustrated with surpressed outgassing characteristics (to be described) to ultra high vacuum levels in the range of $10^{-9}$ to $10^{-10}$ torr and maintaining such vacuum levels for hundreds of hours without reactivation. This could represent a year's operation in normal use.

As shown in the illustrated preferred embodiment, getter 94 comprises a mass 96 of getter material supported by a heater element 98. The heater element is energized by a conductor 100 introduced into the source vacuum enclosure through the multi-pin feed-through 54. To activate or reactivate the getter mass 96, it is only necessary to pass sufficient heater current through the heater element 98 to heat the getter mass 96 to the prescribed temperature. Gasses released from the mass 96 during reactivation are exhausted through an opening 102 in the third lens element 78, through a valving arrangement which will be described in detail hereinafter.

The pumping capacity of the getter 94 depends upon a number of factors; the outgassing rate of the surface of the source enclosure material is an important factor. By far the most significant factor is the composition of the surface material of the first lens element 68, as it is bombarded by electrons from the field emitter tip 48 during normal operation and will outgass profusely if precautions are not taken.

In accordance with an aspect of this invention, the surface of the first lens element 68 is preferably composed of gold, silver or platinum. In a preferred embodiment, the body of the first lens element 68 is composed of titanium alloy or molybdenum for temperature expansion compatibility with the mounting ring 72 and ceramic insulator ring 88. The lens element 68 is preferably coated with one of the aforenamed materials—preferably gold. It has been found that the hydrogen solubility of gold is so low as to create a very acceptably low outgassing rate during normal operation of the source, permitting, as noted, a year's normal operation before reactivation of the getter is necessary.

The above discussion of the necessary pumping rate for the getter 94 assumes a dimension of the differential pumping aperture 82 to be in the size range discussed—10-30 microns, e.g. A getter of the type described might have a pumping capacity of about 2 liters per second in the application described.

Surrounding the source enclosure means is a gun housing 104 having a lining 106 of mu metal. A ring 108 and ceramic insulator 110 interconnect the housing 104 with the cap mounting flange 62 constituting part of the source enclosure means. A plug 111 supports electrical supply cable 113. Appropriate seals 112 and 114 assist in isolating the source enclosure means from the external environment.

In accordance with an aspect of this invention, a scan-stigmator coil assembly 116 provides the functions of a stigmator, and importantly, also serves as means for locating the electron beam focus formed by the first and second lens elements 68, 74 on axis in the vicinity of the aperture 82 in the insert 80 in the third lens element 78. Because the aperture 82 is so small, means are necessary for adjusting the position of the beam focus to its proper location in or through the aperture 82. It should be understood that the scan coils do not actually scan the electron beam in the present application, but are used, as noted, to position the beam relative to the aperture 82. The scan-stigmator coil assembly 116 comprises a hollow cylindrical ceramic mandril 118 on which is wound stigmator and scan coils 20. The scan stigmator coil assembly may be as shown and described in my U.S. Pat. No. 4,725,736.

It is a particularly important aspect of the illustrated embodiment of the invention wherein the source is modular and adapted for independent assembly, testing and storage to provide a valve assembly 16 for controlling the flow of gases to and from the source enclosure 28. The valve assembly 16 may be considered as part of the source enclosure means and serves also as a coupling means for making a vacuum sealed connection to the associated electron beam system on which the source 14 is installed.

The valve assembly 16 is illustrated as comprising two separate valving arrangements—a snap valve assembly 124 for maintaining an ultra high vacuum in the source enclosure 28 during storage and shipping and for quickly closing off the differential pressure aperture 82 in the event of a sudden increase in pressure in the system vacuum enclosure with which the modular encapsulated source 14 is accociated. The valve assembly 122 also includes an exhaust valving arrangement for use during reactivation of the getter 94.

More particularly, the snap valve assembly 124 is illustrated in FIG. 3 in its closed position, and comprises a pivoted snap valve 128 having a seal 130 which may, for example, be composed of soft copper. The snap valve 128 is biased to an open condition during normal operation by a spring 132 (see FIG. 3A). A slide 134 sliding in a slide conduit 136 is actuated by a manually operable reset shaft 138. The shaft 138 is used to reset the snap valve 128 if it has been triggered to its closed position as by sudden loss of vacuum in the associated system enclosure. The snap valve 124 assembly includes metal bellows 140 supported by bellows mount 142. A reset handle housing 144 and shaft journal 143 support and guides the reset shaft 138. The valve assembly 124 includes a valve body plate 123. The seal 130 seats in a seat 131 in plate 123 adjacent the aperture 82.

During shipment and storage, the valve 128 is closed, with spring 145 strongly urging the slide 134 against the valve 128, causing the seal 130 to hermetically engage its seat 131. To open the valve 128 to render the source 14 operative, the handle 147 is withdrawn, permitting spring 132 to force slide 134 back (overcoming the bias of slide spring 153) and thereby retract valve 128. To prevent reclosure, the handle 147 is rotated, locking bayonnet 149 behind a wall 151 in bellows mount 142 (see FIG. 3).

If the pressure in column 10 should suddenly increase, causing valve 128 to close, slide 134 will follow valve 128 (due to slide spring 153), picking up reset finger 155 in groove 157. The handle 147 may then be rotated to release the shaft 138 and lock the valve 128 closed.

The exhaust valve arrangement 126 comprises a screw-driven soft copper seal 146 which seats in a seat 148 in the valve body plate 123 when in the closed position. The seal 146 may be withdrawn to an open position by rotating the assembly, which exposes an exhaust opening 150 in the valve body 123. As noted, the exhaust valve arrangement is utilized to exhaust gases emitted by the getter during reactivation, and otherwise is closed.

The above-described embodiment is illustrative only and it is contemplated that other structures may be devised to practice the teachings of the invention. As described, other embodiments of the invention are contemplated which are not modular in adaption and thus which would not have a valve assembly of the type shown intended to facilitate independent assembly, testing and storage of the source. Certain systems may be such that no valving arrangement of any kind is necessary or desirable. For example, the encapsulated source of this invention, modular or permanently built-in, may be adapted as part of a high voltage terminal for a high voltage electron microscipe, as shown in FIG. 6, for example.

Figure 6:
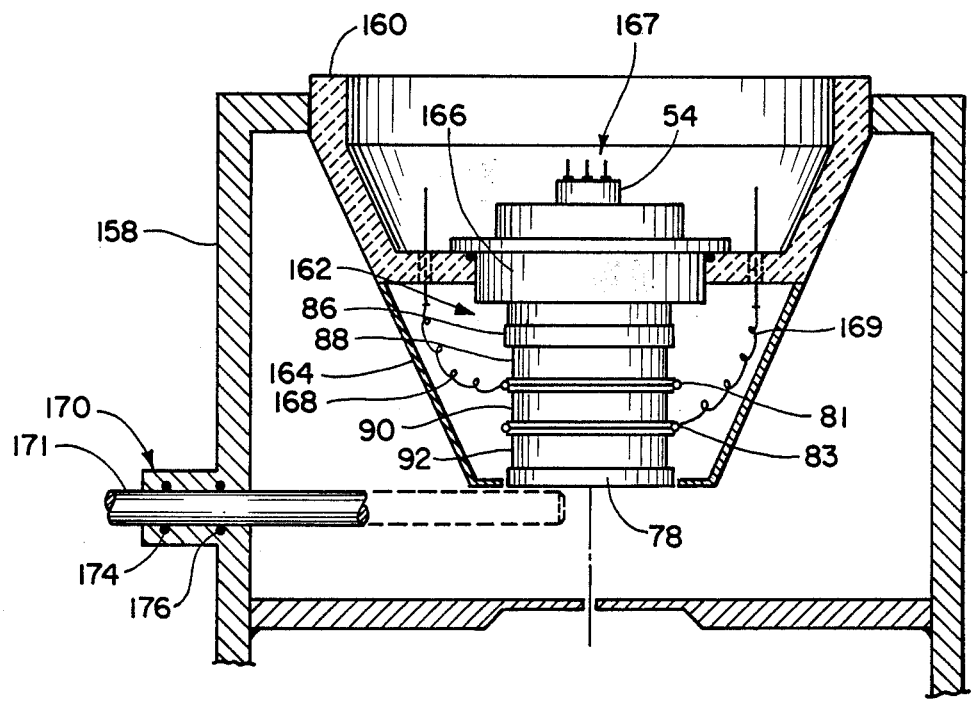
FIG. 6 is a view of an alternative embodiment of the invention adapted for use in a high voltage electron beam system.
Figure 5:
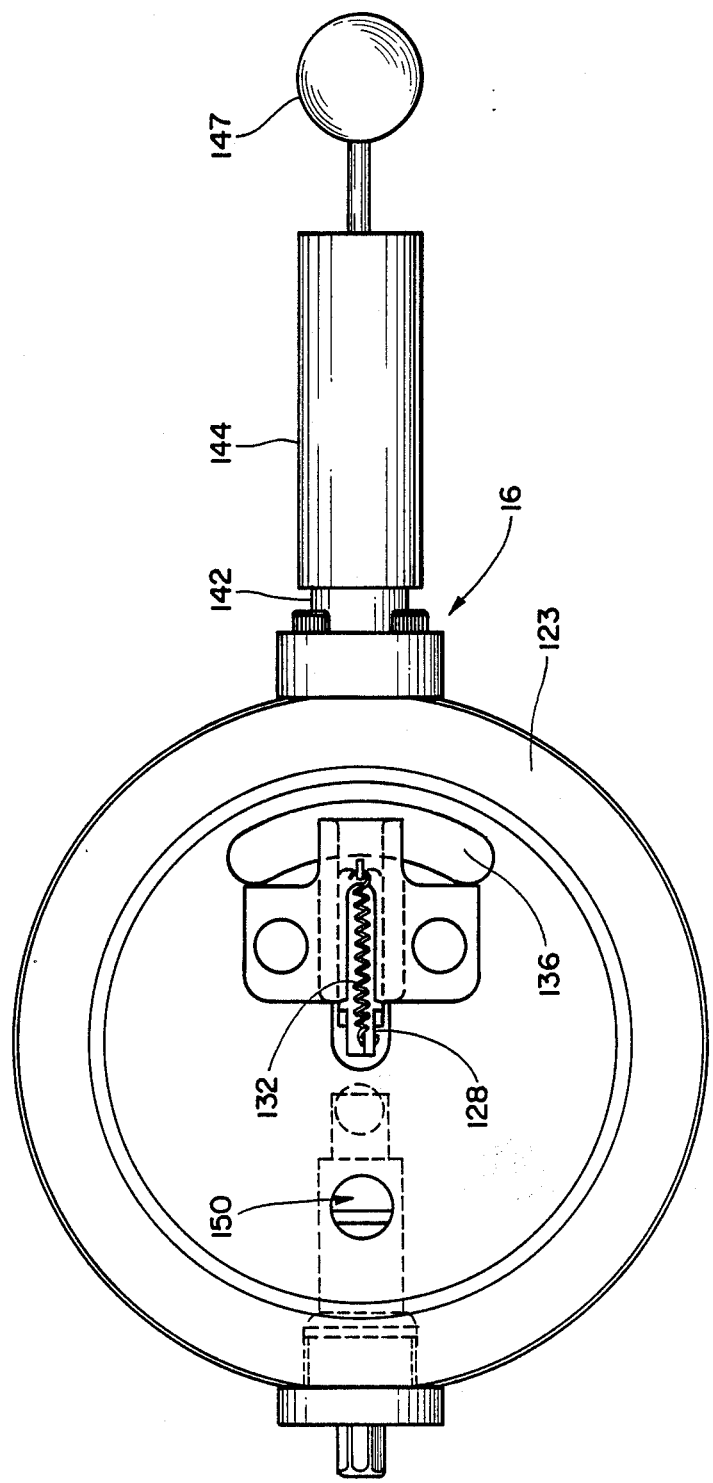
FIG. 5 is a bottom view of the FIG. 3 assembly.

FIG. 6 illustrates a gun housing 158 supporting a high voltage insulator 160 which in turn supports an encapsulated source 162 following the teachings of this invention, as described above. A corona shield is shown at 164. Reference numerals in FIG. 6 common to other figures indicate like structure. Part 166 is an adaptation of parts 84 and 62 in FIG. 3. Conductor terminals are shown at 167. Leads to loop terminals 81, 83 are shown at 168, 169.

One difference between the FIG. 6 embodiment and the FIGS. 3-4 embodiment is that the FIG. 6 embodiment is not modular in adaptation. An exhaust valve arrangement 170 in FIG. 6 is not part of a valve assembly such as shown at 16 which serves as a coupling means and which includes a snap valve. Valve arrangement 170 is illustrated, in part, as comprising a retractable exhaust tube 171 sealed to gun housing 158 by means of a pair of O-rings 174, 176.

Other configurations of high brightness sources and lensing arrangements may be employed. Many valving structures other than as shown may be used with the illustrated or other arrangements of passive pumping means.

The following claims are intended to cover not only the illustrated structure but also other structures which utilize my teachings.

I claim:

1. A differential pressure electron beam system, comprising:
   system vacuum enclosure means defining a system vacuum enclosure;
   vacuum pumping means for evacuating said system vacuum enclosure to a predetermined moderate vacuum level; and
   a modular high brightness source of electrons, comprising:
   source vacuum enclosure means defining a source vacuum enclosure, said source vacuum enclosure means defining a differential pressure aperture communicating with said system vacuum enclosure;
   a field emission cathode within said source vacuum enclosure requiring an ultra high vacuum environment for efficient operation, and
   non-evaporable porous getter means within or in communication with said source vacuum enclosure for passively pumping said source vacuum enclosure to a predetermined ultra high vacuum level significantly higher than said moderate vacuum level, said getter means having sufficient pumping capacity to maintain said predetermined ultra high vacuum level in said source vacuum enclosure despite the existence of said differential pressure aperture;
   whereby, by the use of a self-pumped field emission source not requiring a costly ultra high vacuum pumping system, there is provided a system having the desirable capabilities attending use of a field emission source at a cost more typical of systems having much less capable sources.

2. A differential pressure electron beam system, comprising:
   system vacuum enclosure means defining a system vacuum enclosure including a specimen chamber;
   vacuum pumping means for evacuating said system vacuum enclosure; and
   a high brightness source of electrons, comprising:
   source vacuum enclosure means defining a source vacuum enclosure, including coupling means for making a vacuum-sealed connection to said system vacuum enclosure means, said source vacuum enclosure means defining a differential pressure aperture communicating with said system vacuum enclosure when said source vacuum enclosure means is coupled to said system vacuum enclosure means,
   a high brightness cathode within said source vacuum enclosure requiring an ultra high vacuum environment for efficient operation,
   passive electron pumping means within or in communication with said source vacuum enclosure for passively pumping said source vacuum enclosure to a predetermined ultra high vacuum level significantly higher than the vacuum level in said system vacuum enclosure, said passive pumping means having sufficient pumping capacity to maintain said predetermined ultra high vacuum level in said source vacuum enclosure despite the existence of said differential pressure aperture;
   whereby, by the use of a self-pumped high brightness source not requiring a costly ultra high vacuum pumping system, there is provided a system having the desirable capabilities attending use of such a high brightness source at a cost more typical of systems having much less capable sources.

3. A differential pressure electron beam system, comprising:
   system vacuum enclosure means defining a system vacuum enclosure including a specimen chamber;
   vacuum pumping means for evacuating said system vacuum enclosure; and
   a modular encapsulated high brightness source of electrons, comprising:
   source vacuum enclosure means defining a source vacuum enclosure, including coupling means for making a vacuum sealed connection to said system vacuum enclosure means, said source vacuum enclosure means defining a differential pressure aperture communicating with said system vacuum enclosure when said source vacuum enclosure means is coupled to said system vacuum enclosure means,
   a field emission cathode within said source vacuum enclosure requiring an ultra high vacuum environment for efficient operation,
   non-evaporable porous getter means within or in communication with said source vacuum enclosure for passively pumping said source vacuum enclosure to a predetermined ultra high vacuum level significantly higher than the vacuum level in said system vacuum enclosure, said getter means having sufficient pumping capacity to maintain said predetermined ultra high vacuum level in said source vacuum enclosure despite the existence of said differential pressure aperture;
   whereby, by the use of a modular self-pumped field emission source not requiring a costly ultra high vacuum pumping system, there is provided a system having the desirable capabilities attending use of such a field emission source at a cost more typical of systems having much less capable sources.

4. A differential pressure electron beam system, comprising:
   system vacuum enclosure means defining a system vacuum enclosure including a specimen chamber;
   vacuum pumping means for evacuating said system vacuum enclosure; and
   a modular encapsulated high brightness source of electrons, comprising:
   source vacuum enclosure means defining a source vacuum enclosure, including coupling means for making a vacuum sealed connection to said system vacuum enclosure means, said source vacuum enclosure means defining a differential pressure aperture communicating with said system vacuum enclosure when said source vacuum enclosure means is coupled to said system vacuum enclosure means,
   valve means for selectively hermetically sealing said differential pressure aperture;
   a high brightness cathode within said source vacuum enclosure requiring an ultra high vacuum environment for efficient operation,
   passive electron pumping means within or in communication with said source vacuum enclosure for passively pumping said source vacuum enclosure to a predetermined ultra high vacuum level significantly higher than the vacuum level in said system vacuum enclosure, said passive pumping means having sufficient pumping capacity to maintain said predetermined ultra high vacuum level in said source vacuum enclosure despite the existence of said differential pressure aperture;

whereby, by the use of a modular self-pumped high brightness source not requiring a costly ultra high vacuum pumping system, there is provided a system having the desirable capabilities attending use of a high brightness source at a cost more typical of systems having much less capable sources, and having the capability of being sealed and pre-tested for installation at an ultra-high-vacuum operative condition.

5. A differential pressure electron beam system, comprising:

system vacuum enclosure means defining a system vacuum enclosure including a specimen chamber;

vacuum pumping means for evacuating said system vacuum enclosure; and a modular encapsulated high brightness source of electrons, comprising:

source vacuum enclosure means defining a source vacuum enclosure, including coupling means for making a vacuum-sealed connection to said system vacuum enclosure means, said source vacuum enclosure means defining a differential pressure aperture communicating with said system vacuum enclosure when said source vacuum enclosure means is coupled to said system vacuum enclosure means, valve means for selectively hermetically sealing said differential pressure aperture, said valve means having means for automatically closing said differential pressure aperture if the pressure in said system vacuum enclosure rises suddenly, a field emission cathode within said source vacuum enclosure requiring an ultra high vacuum environment for efficient operation, non-evaporable porous getter means within or in communication with said source vacuum enclosure for passively pumping said source vacuum enclosure to a predetermined ultra high vacuum level significantly higher than the vacuum level in said system vacuum enclosure, said getter means having sufficient pumping capacity to maintain said predetermined ultra high vacuum level in said source vacuum enclosure despite the existence of said differntial pressure aperture;

whereby, the the use of a modular self-pumped field emission source not requiring costly ultra high vaccum pumping system, there is provided a system having the desirable capabilities attending use of a field emission source at a cost more typical of systems having much less capable soures, and having the capability of being sealed and pre-tested for installation in an ultra high vacuum operative condition.

6. A differential pressure electron beam system, comprising:

system vacuum enclosure means defining a system vacuum enclosure including a specimen chamber;

vacuum pumping means for evacuating said system vacuum enclosure; and a modular encapsulated high brightness source of electrons, comprising:

source vacuum enclosure means defining a source vacuum enclosure, including coupling means for making a vacuum sealed connection to said system vacuum enclosure means, said source vacuum enclosure means defining a differential pressure aperture communicating with said system vacuum enclosure when said source vacuum enclosure means is coupled to said system vacuum enclosure means, a high brightness cathode within said source vacuum enclosure requiring an ultra high vacuum environment for efficient operation, electrode means receiving electrons from said cathode for focusing said electrons on axis in the vicinity of said differential pressure aperture, the electron focus thus formed serving as the electron source for said electron beam system, passive electron pumping means within or in communication with said source vacuum enclosure for passively pumping said source vacuum enclosure to a predetermined ultra high vacuum level significantly higher than the vacuum level in said system vacuum enclosure, said passive pumping means having sufficient pumping capacity to maintain said predetermined ultra high vacuum level in said source vacuum enclosure despite the existence of said differential pressure aperture;

whereby, by the use of a modular self-pumped high brightness source not requiring a costly ultra high vacuum pumping system, there is provided a system having the desirable capabilities attending use of such a high brightness source at a cost more typical of systems having much less capable sources.

7. A differential pressure electron beam system, comprising:

system vacuum enclosure means defining a system vacuum enclosure including a specimen chamber;

vacuum pumping means for evacuating said system vacuum enclosure; and a modular encapsulated high brightness source of electrons, comprising:

source vacuum enclosure means defining a source vacuum enclosure, including coupling means for making a vacuum sealed connection to said system vacuum enclosure means, said source vacuum enclosure means defining a differential pressure aperture communicating with said system vacuum enclosure when said source vacuum enclosure means is coupled to said system vacuum enclosure means, a field emission cathode within said source vacuum enclosure requiring an ultra high vacuum environment for efficient operation, electrode means receiving electrons from said field emission cathode for focusing said electrons on axis in the vicinity of said differential pressure aperture, the electron focus thus formed serving as the electron source for said electron beam system, non-evaporable porous getter means within or in communication with said source vacuum enclosure for passively pumping said source vacuum enclosure to a predetermined ultra high vacuum level significantly higher than the vacuum level in said system vacuum enclosure, said getter means having sufficient pumping capacity to maintain said predetermined ultra high vacuum level in said source vacuum enclosure despite the existence of said differential pressure aperture;

whereby, by the use of a modular self-pumped field emission source not requiring a costly ultra high vacuum pumping system, there is provided a system having the desirable capabilities attending use of a field emission source at a cost more typical of systems having much less capable sources.

8. The apparatus defined by claim 7, including valve means for selectively hermetically sealing said differential pressure aperture, the system thus having the capability of being sealed and pretested for installation in an ultra high vacuum operative condition.

9. A differential pressure electron beam system comprising:

system vacuum enclosure means defining a system vacuum enclosure including a specimen chamber;

vacuum pumping means for evacuating said system vacuum enclosure; and a modular encapsulated high brightness source of electrons, comprising:

source vacuum enclosure means defining a source vacuum enclosure, including coupling means for making a vacuum-sealed connection to said system vacuum enclosure means, said source vacuum enclosure means defining a differential pressure aperture communicating with said system vacuum enclosure when said source vacuum enclosure means is coupled to said vacuum enclosure means, a high brightness cathode within said source vacuum enclosure requiring an ultra high vacuum environment for efficient operation, electrode means receiving electrons from said cathode for focusing said electrons on axis in the vicinity of said differential pressure aperture, the electron focus thus formed serving as the electron source for said electron beam system, said electrode means including a first lens element defining said differential pressure aperature, said electrode means including two additional lens elements for collecting electrons from said field emission cathode and forming said focus, passive electron pumping means within or in communication with said source vacuum enclosure for passively pumping said source vacuum enclosure to a predetermined ultra high vacuum level significantly higher than the vacuum level in said system vacuum enclosure, said passive pumping means having sufficient pumping capacity to maintain said predetermined ultra high vacuum level in said source vacuum enclosure despite the existence of said differential pressure aperture;

whereby, by the use of a modular self-pumped high brightness source not requiring a costly ultra high vacuum pumping system, there is provided a system having the desirable capabilities attending use of such a high brightness source at a cost more typical of systems having mush less capable sources.

10. For use with an electron beam system including system vacuum enclosure means defining a system vacuum enclosure, a modular encapsulated high brightness source of electrons, comprising:

source vacuum enclosure means defining a source vacuum enclosure, including means for hermetically coupling said source vacuum enclosure means to a system vacuum enclosure means, said source vacuum enclosure means defining a differential pressure aperture for communicating with said system vacuum enclosure when said source vacuum enclosure means is coupled to said system vacuum enclosure means;

a high brightness cathode requiring an ultra high vacuum environment for efficient operation;

electrode means for receiving electrons from said cathode and for focusing said electrons on axis in the vicinity of said differential pressure aperture to serve as the electron source in a system in which it is installed; and passive electron pumping means within or in communication with said soruce vacuum enclosure for passively pumping said source vacuum enclosure to a predetermined ultra high vacuum level, said passive pumping means having sufficient pumping capacity to maintain said predetermined ultra high vacuum level in said source vacuum enclosure despite the existence of said differential pressure aperture, whereby, by the use of a modular self-pumped high brightness source not requiring a costly high vacuum pumping system, an electron beam system can be given the desirable capabilities attending use of such a high brightness source at a cost more typical of systems having much less capable sources.

11. For use with an electron beam system including system vacuum enclosure means defining a system vacuum enclosure, a modular encapsulated high brightness source of electrons, comprising:

source vacuum enclosure means defining a source vacuum enclosure, including means for hermetically coupling said source vacuum enclosure means to a system vacuum enclosure means, said source vacuum enclosure means defining a differential pressure aperture for communicating with said system vacuum enclosure when said source vacuum enclosure means is coupled to said system vacuum enclosure means;

said source vacuum enclosure means further including means for selectively and controllably sealing off said differential pressure aperture to permit testing and shipment of said source while in an ultra high vacuum state;

a field emission cathode requiring an ultra high vacuum environment for efficient operation;

electrode means for receiving electrons from said cathode and for focusing said electrons on axis in the vicinity of said differential pressure aperture to serve as the electrode source in a system in which it is installed, said electrode means constituting part of a three element electrode system, the third element defining said differential pressure aperture and constituting part of the source vacuum enclosure means, first and second lens elements being adapted to receive predetermined potentials effective to cause said focusing of said electrons from said cathode on acis in the vicinity of said differential pressure aperture in said third lens element; and non-evaporable porous getter means within or in communication with said source vacuum enclosure for passively pumping said source vacuum enclosure to a predetermined ultra high vacuum level, said getter means having sufficient pumping capacity to maintain said predetermined ultra high vacuum level in said source vacuum enclosure despite the existence of said differential pressure aperture, whereby, by the use of a modular self-pumped field emission source not requiring a costly high vacuum pumping system, an electron beam system can be given the desirable capabilities attending use of such a field emission source at a cost more typical of systems having much less capable sources.

12. For use with an electron beam system including system vacuum enclosure means defining a system vacuum enclosure a modular encapsulated high brightness source of electrons, comprising:

source vacuum enclosure means defining a source vacuum enclosure, including means for hermetically coupling said source vacuum enclosure means to a system vacuum enclosure means, said source vacuum enclosure means defining a differential pressure aperture for communicating with said system vacuum enclosure when said source vacuum enclosure means is coupled to said system vacuum enclosure means;

a high brightness cathode requiring an ultra high vacuum environment for efficient operation;

electrode means for receiving electrons from said cathode and for focusing said electrons on axis in the vicinity of said differential pressure aperture to serve as the electron source in a system in which it is installed, said electrode means constituting part of a three element electrode system, the third element defining said differential pressure aperture and constituting part of the source vacuum enclosure means, first and second lens elements being adapted to receive predetermined potentials effective to cause said focusing of said electrons from said cathode on axis in the vicinity of said differential pressure aperture; and passive electron pumping means within or in communication with said source vacuum enclosure for passively pumping said source vacuum enclosure to a predetermined ultra high vacuum level, said passive pumping means having sufficient pumping capacity to maintain said predetermined ultra high vacuum level in said source vacuum enclosure despite the existence of said differential pressure aperture, whereby, by the use of a modular self-pumped high brightness source not requiring a costly high vacuum pumping system, an electron beam system can be given the desirable capabilities attending use of such a high brightness source at a cost more typical of systems having much less capable sources.

13. For use with an electron beam system including system vacuum enclosure means defining a system vacuum enclosure, a modular encapsulated high brightness source of electrons, comprising:

source vacuum enclosure means defining a source vacuum enclosure, including means for hermetically coupling said source vacuum enclosure means to a system vacuum enclosure means, said source vacuum enclosure means defining a differential pressure aperture for communicating with said source vacuum enclosure when said source vacuum enclosure means is coupled to said system vacuum enclosure means;

a high brightness cathode requiring an ultra high vacuum environment for efficient operation; and electrode means for receiving electrons from said cathode and for focusing said electrons in or in the vicinity of said differential pressure aperture to serve as the electron source in a system in which it is installed, said electrode means including a first lens element adjacent said cathode having a surface composition consisting of gold, silver or platinum.

14. The apparatus defined by 13 wherein said first lens element is composed of gold-plated molybdenum or titanium alloy.

15. A high brightness electron source comprising a field emission tip and anode means for drawing electrons from said tip, said anode having a surface facing the tip which is selected from the group of materials consisting of gold, silver, and platinum.

16. The apparatus defined by 15 wherein said anode is composed of gold-plated titanium alloy or molybdenum.

17. An electron gun for use in an electron beam system, comprising a field emission tip, means defining a differential pumping aperture, and means for imaging the electron source defined by said tip on axis in the vicinity of said differential pumping aperture such that the focus thus formed may serve as an electron source for the electron beam system.

18. An electron gun for use in an electron beam system, comprising a field emission tip, means defining a differential pumping aperture, and means for imaging the electron source defined by said tip on axis in the vicinity of said differential pumping aperture such that the focus thus formed may serve as an electron source for the electron beam system, said gun including means for controllably adjusting the position of said beam focus for locating it on axis in the vicinity of said aperture.

* * * * *